United States Patent
Tan et al.

(10) Patent No.: US 9,686,892 B2
(45) Date of Patent: Jun. 20, 2017

(54) MULTI-PERIOD MASTER-SLAVE NESTED RING ARRAY ELECTROMAGNETIC SHIELDING OPTICAL WINDOW HAVING CONCENTRIC RINGS

(71) Applicant: HARBIN INSTITUTE OF TECHNOLOGY, Heilongjiang (CN)

(72) Inventors: Jiubin Tan, Heilongjiang (CN); Zhengang Lu, Heilongjiang (CN)

(73) Assignee: HARBIN INSTITUTE OF TECHNOLOGY, Heilongjiang (CN)

( * ) Notice: Subject to any disclaimer, the term of this patent is extended or adjusted under 35 U.S.C. 154(b) by 0 days.

(21) Appl. No.: 15/118,820

(22) PCT Filed: Dec. 16, 2014

(86) PCT No.: PCT/CN2014/093898
§ 371 (c)(1),
(2) Date: Aug. 12, 2016

(87) PCT Pub. No.: WO2015/120739
PCT Pub. Date: Aug. 20, 2015

(65) Prior Publication Data
US 2017/0055381 A1    Feb. 23, 2017

(30) Foreign Application Priority Data
Feb. 14, 2014  (CN) .......................... 2014 1 0051497

(51) Int. Cl.
*H05K 9/00*    (2006.01)
*G02B 5/18*    (2006.01)

(52) U.S. Cl.
CPC ......... *H05K 9/0094* (2013.01); *H05K 9/0086* (2013.01); *G02B 5/1866* (2013.01); *G02B 2207/121* (2013.01)

(58) Field of Classification Search
CPC ............... H05K 9/0094; H05K 9/0096; G02B 2207/121
See application file for complete search history.

(56) References Cited

U.S. PATENT DOCUMENTS 4,772,760 A * 9/1988 Graham ................ B64C 1/1476
                                                174/389
4,871,220 A   10/1989 Kohin
                (Continued)

FOREIGN PATENT DOCUMENTS

CN    2203342      7/1995
CN    101917837    7/1995
        (Continued)

OTHER PUBLICATIONS

International Preliminary Report on Patentability for Chinese Application No. PCT/CN2014/093898 dated Aug. 16, 2016.
(Continued)

*Primary Examiner* — Hung V Ngo
(74) *Attorney, Agent, or Firm* — Jenkins, Wilson, Taylor & Hunt, P.A.

(57) ABSTRACT

Optical windows based on a multi-period master-slave nested ring array of concentric rings are suited for electromagnetic shielding. A metal grid of the ring array has basic rings, concentric sub-ring pairs, secondary sub-rings, filling rings, concentric modulation ring pairs, and modulation sub-rings. Basic rings and concentric modulation ring pairs form a two-dimensional orthogonal array. External rings of concentric modulation ring pairs are externally tangentially connected to basic rings. Concentric sub-ring pairs and filling rings are arranged within basic rings, secondary sub-rings are arranged within concentric sub-ring pairs, and modulation sub-rings are arranged within concentric modulation ring pairs. Where rings are tangentially connected, wires overlap or metal ensures reliable electrical connec-
(Continued)

tions between connected rings, thus all rings are conductive. The metal grid structure significantly reduces non-uniformity of grid high-order diffracted light intensity distribution, causing stray light distribution caused by diffraction to be more uniform and imaging to be less affected.

10 Claims, 8 Drawing Sheets

(56) References Cited

U.S. PATENT DOCUMENTS

| | | | | |
|---|---|---|---|---|
| 5,017,419 | A * | 5/1991 | Smith | G03F 7/0007 174/390 |
| 9,320,136 | B2 * | 4/2016 | Frey | H05K 1/0274 |
| 2003/0013048 | A1 * | 1/2003 | Gilson | H05K 9/0096 430/321 |
| 2009/0027300 | A1 * | 1/2009 | Kudo | H05K 9/0003 343/912 |
| 2010/0136288 | A1 * | 6/2010 | Tanaka | H01J 11/44 428/141 |
| 2010/0180428 | A1 * | 7/2010 | Jones | H05K 9/0094 29/592.1 |
| 2011/0297436 | A1 * | 12/2011 | Ohashi | B05D 1/00 174/389 |
| 2014/0158417 | A1 * | 6/2014 | Zmek | H05K 9/0094 174/389 |

FOREIGN PATENT DOCUMENTS

| | | |
|---|---|---|
| CN | 2233113 | 8/1996 |
| CN | 1200231 | 11/1998 |
| CN | 1482853 | 3/2004 |
| CN | 1522107 | 8/2004 |
| CN | 1870881 | 11/2006 |
| CN | 1889822 | 1/2007 |
| CN | 101222839 | 7/2008 |
| CN | 101222840 | 7/2008 |
| WO | WO 2015120739 | 8/2015 |

OTHER PUBLICATIONS

"Numerical comparison of grid pattern diffraction effects through measurement and modeling with OptiScan software", Proc. SPIE, 2011, 8016: 80160U-1-80160U-15.

"Predicted and measured transmission and diffraction by a metallic mesh coating", Proc. SPIE, 2009, 7302:73020&-1-73020Y-8.

International Search Report for Application No. PCT/CN2014/093898 dated Mar. 9, 2015.

* cited by examiner (a) (b) (c) (d)

(a) (b) (c)

MULTI-PERIOD MASTER-SLAVE NESTED RING ARRAY ELECTROMAGNETIC SHIELDING OPTICAL WINDOW HAVING CONCENTRIC RINGS

TECHNICAL FIELD

The present invention belongs to the field of electromagnetic shielding of an optical transparent piece, and particularly relates to a multi-period master-slave nested ring array electromagnetic shielding optical window having concentric rings.

BACKGROUND ART

With the increase of the broadening and strength of the application spectrum of electromagnetic waves, requirements for electromagnetic shielding optical windows in the field of aerospace equipment, advanced optical instrument, communication equipment, medical diagnostic equipment and confidential facilities, etc. are higher and higher. The optical window is mainly requested to have super strong capability of wide-band electromagnetic shielding, high light transmittance, and the less impact on optical imaging, observation and detection the better. For example, in the field of aerospace equipment, optical window of the aircraft must achieve a high-quality electromagnetic signal isolation inside and outside the cabin, which on the one hand can shield external electromagnetic interference and harmful electromagnetic signals to avoid failure of the electronic equipment in the cabin, and on the other hand prevent electromagnetic signals from transmitting out of the optical window and causing electromagnetic leakage during operation of the electronic equipment in the cabin. However, light transmission is an essential function of the optical window, so electromagnetic shielding of the optical window should reduce the impact on the transparency of the optical window as much as possible, in particular the impact on functions of optical detection or optical imaging. Similarly, optical window of advanced optical instrument should have as high light transmittance as possible and as low impact on image quality as possible, so as to achieve high-quality detection and measurement, and to prevent impact of electromagnetic interference on photodetectors inside the instrument; for confidential building facilities for government agencies, military command areas and important scientific research units, the window glass of the houses needs to be guaranteed in lighting and also designed with electromagnetic shielding to prevent secret from divulging due to important information transmitting out of the window in the form of electromagnetic radiation when indoor computers and other electronic equipment are at work; optical window of the medical electromagnetic isolation chamber needs to ensure that the vast majority of the indoor electromagnetic waves is shielded to prevent health damage to the outdoor operator for always suffering electromagnetic radiation, etc. Currently, a transparent conductive film, a metal induced transmission type multi-layer film structure, the band-block frequency selective surface and a metal grid having a millimeter or submillimeter period, etc. are mainly used for electromagnetic shielding of this type of optical window.

The transparent conductive film is a transparent metal oxide film comprising indium tin oxide as the main material, and is often used in occasions where the visible light wave band is transparent, but is not suitable for the wide lucent wave-band, because it does not have strong shielding capability though having wide microwave shielding wave-band. Metal-induced transmission type multilayer film structure realizes shielding of the electromagnetic waves by using a composite structure of multilayer metal thin films and dielectric films. It has relatively strong ability of shielding low-frequency microwaves, but its light transmission rate is not high because the transmission regions are mainly visible light and ultraviolet light. Frequency selective surface uses the periodic resonating unit structure to achieve the functions of a band-pass or band-block filter, and because of its high metal coverage, it can effectively reflect the interfering electromagnetic waves beyond the operating band, but the optical transmittance is relatively low thereby reducing the imaging quality for optical detection and causing difficulty in optical image processing, pattern recognition, target acquisition and tracking. In sum, all the above technical solutions are obviously deficient in meeting the two requirements of the optical window having high light transmittance at wide waveband and high electromagnetic shielding ability at wide frequency band. In contrast, a metal grid having a period in millimeter or sub-millimeter can achieve strong electromagnetic shielding at low frequency and wide waveband because its period is much shorter than the interfering electromagnetic wavelength. The period of the metal grid is much longer than the optical wavelength, and thus can guarantee transmittance of optical waveband. Therefore, the metal grid with a period in millimeter or sub-millimeter has good transparent and conductive performances and can meet the requirements of the optical window for high light transmittance and wideband electromagnetic shielding, so it has been widely applied in the technical field of electromagnetic shielding of an optical window.

1. In Patent No. 03115313.5 with the title of "An Electromagnetic Shielding Observation Window", a single- or multiple-layer metal mesh and a semiconductor-like quantum well structure are used to form an electromagnetic shielding structure, which can achieve an electromagnetic shielding efficiency of over 50 dB within 10 GHz and a light transmittance of up to 50% or more at the high visible light transmission area.

2. In Patent No. 93242068.0 with the title of "Electromagnetic Shielding Glass", an electromagnetic shielding structure is formed by sandwiching a conductive metal mesh between two layers of glass and adhering on the metal frame by using a conductive transparent film at the outer sides of the glass, and such structure has certain lighting property.

3. In Patent No. 94231862.5 with the title of "An Electromagnetic Shielding Observation Window Having no Moiré Fringe", two layers of metal meshes which are different in number are placed in parallel, and their warp or weft form an included angle, so as to eliminate the Moiré fringe phenomenon and achieve a clearer view.

4. In Patent No. 02157954.7 with the title of "Highly Effective Information Leakage-Preventing Glass", each side of the metal mesh is provided with a layer of polycarbonate film whose outer sides are attached to a glass layer, and heat pressing is performed to form an electromagnetic shielding structure; such structure has high shielding efficiency when the light transmittance comes up to 60%.

5. Patent No. 200610084149.8 with the title of "Electromagnetic Wave Shielding Film and Method for Manufacturing the Same" describes a highly transparent electromagnetic shielding film having a metal mesh pattern formed by the photolithography process, and the main object of the invention is to reduce consumption of the metal and overcome the environmental pollution resulting from the use of a curing adhesive between the metal layer and the film substrate.

6. The U.S. Pat. No. 4,871,220 with the title of "Short wavelength pass filter having a metal mesh on a semiconducting substrate" describes a metal mesh having a square-shaped structure, which is used for achieving the anti-electromagnetic interference performance of the optical window.

7. Patent No. 201010239355.8 with the title of "An Electromagnetic Shielding Conformal Optical Window Having a Weft-Warp Grid Structure" describes an electromagnetic shielding conformal optical window having a weft-warp metal grid structure formed by using the metal grid technology and the conformal optical window technology, and mainly solves the problem of the structure design of the metal grid of the conformal optical window and improves the electromagnetic shielding performance of the conformal optical window.

8. Patent No. 200610010066.4 with the title of "Electromagnetic Shielding Optical Window Having Ring Metal Grid Structure" describes a metal grid unit having a ring-shaped profile, which is used for achieving the electromagnetic shielding function of the optical window; as compared to the single-layer squared metal grid, the light transmittance and shielding capability have been improved, and stray light caused by high order diffraction has also been homogenized in a certain degree.

9. Patent No. 200810063988.0 with the title of "An electromagnetic shielding optical window having a double-layer squared metal grid structure" describes an electromagnetic shielding optical window which is formed by placing squared metal grids or metal meshes having the same structural parameters in parallel on both sides of an optical window or a transparent substrate, and the electromagnetic shielding efficiency is greatly improved without reducing the light transmittance.

10. Patent No. 200810063987.6 with the title of "An electromagnetic shielding optical window having a double-layer ring-shaped metal grid structure" describes an electromagnetic shielding optical window formed by loading two layers of ring metal grids to both sides of the optical window, and solves the problem that the high light transmittance and high electromagnetic shielding efficiency cannot be achieved simultaneously.

11. Jennifer I. Halman etc. from the United States Battelle Institute developed an inductive metal grid having a ring unit-based hub-spoke stripe structure and a multi-ring overlapping structure (Jennifer I. Halman, etc., "Predicted and measured transmission and diffraction by a metallic mesh coating", Proc. SPIE, 2009, 7302: 73020Y-1-73020Y-8), and believed that by the function of the rings, such structure can achieve homogenization of the grid high-order diffraction distribution and low sidelobe, and is favorable for imaging.

12. Ian B. Murray from the US Exotic Electro-Optics Company, together with Victor Densmore and Vaibhav Bora from University of Arizona. US, etc. reported the impact on the diffraction property after introducing parameters into an inductive metal grid having a hub-spoke stripe structure and a multi-ring overlapping structure and designing with random distribution (Ian B. Murray, Victor Densmore, Vaibhav Bora et al., "Numerical comparison of grid pattern diffraction effects through measurement and modeling with OptiScan software", Proc. SPIE, 2011, 8016: 80160U-1-80160U-15), and pointed out that spacing and diameter of the rings are set as random values within a certain range, which is helpful to improve the uniformity of the high-order diffraction distribution.

With the metal grid (or metal mesh) as the core device for shielding, the above solutions can achieve good electromagnetic shielding effect and certain light transmittance. However, when metal grid (or metal mesh) is used as the electromagnetic shielding structure, the impact of the optical waveband diffraction by the grid is inevitable. Since the period of the metal grid is in the magnitude of millimeter or sub-millimeter, in order to achieve high light transmittance, its metal line width is generally in the magnitude of micron and submicron, such configuration parameter has very intense diffraction effect in the optical waveband. Most of the energy of the incident light can be transmitted through the metal grid, and the transmitted portion comprises a zero-order diffracted light and high-order diffracted light. Generally, zero-order diffracted light is useful information for imaging and observation, and the high-order diffracted light constitutes stray light which interferes imaging and detection. Therefore, the proportion of the zero-order diffracted light should be increased as much as possible, and the high-order diffracted light should be allowed to be uniformly distributed if its occurrence cannot be avoided, so that the stray light thus formed becomes comparatively uniform background or noise.

Currently, the metal grids are mainly in the traditional squared grid structure, as the structure mainly adopted in Patent 1-6 (the structure in Patent 7 is a grid-like structure, for it is processed on a curved surface). Squared grid structure is inherently contradictory between light transmission and shielding capability, and cannot have both high light transmittance and high electromagnetic shielding efficiency. In particular, the high-order diffraction energy of the squared grid is mainly concentrated on two axes perpendicular to each other, causing certain impact on the imaging quality or even difficulty in application in occasions having high requirements for imaging quality. A change in the diffraction property of the grid usually requires a change in its structure feature. The above-mentioned patent 200610010066.4 with the title of "an electromagnetic shielding optical window having a ring metal grid structure" proposed to construct a ring metal grid by using metal rings, which overcome the defect of the concentrated distribution of the high-order diffraction energy of the squared metal grid and may ease the contradiction between its light transmission ability and shielding capability. In the above documents 11 and 12, Jennifer I. Halman et al. and Ian B. Murray et al. also proposed a ring unit-based metal grid structure for improving the uniformity of the high-order diffraction distribution. However, studies of Jennifer I. Halman etc. relate to a single period ring arrangement structure, and the direction of arrangement is determined, and its effect on regulating the high-order diffraction is comparative to that of the structure proposed in Patent No. 200610010066.4. Although Ian B. Murray et al. made further research and proposed a randomly overlapping ring structure, in which the diameter and spacing of the rings are set as values based on random distribution in a certain range and which achieves further improvement on the uniformity of the high-order diffraction distribution, such random distribution of the diameters and spaces of the rings changes the uniformity of the mesh distribution, causing damage to the electromagnetic shielding efficiency.

With the increasingly complex electromagnetic environment, electromagnetic shielding optical windows are required to have increasingly high light transmittance and electromagnetic shielding capacity. Particularly in the fields of aerospace equipment and advanced optical instruments, optical windows has been required to have not only a light transmittance of 95% or higher, but also an extremely low impact on the imaging quality, and achieve a shielding efficiency of 30 dB or more in a microwave frequency range of less than 20 GHz, which is difficult to be realized by the existing technology. Both Patent 200810063988.0 and Patent 200810063987.6 utilizes a double-layer metal grid placed in parallel on both sides of the transparent substrate of the optical window, and the two layers of metal grids have the same unit shape and structure parameters. By optimizing the distance between two layers of grids, the electromagnetic shielding efficiency can be significantly improved without lowering the light transmittance. However, distribution of the high-order diffraction stray light of this double-layer grid structure is comparative to that of the single-layer grid structure having the same light transmittance, and cannot fully meet the requirements for low impact on the image quality in the fields of future aerospace equipment and advanced optical instruments.

SUMMARY OF INVENTION

An object of the present invention is to develop an electromagnetic shielding optical window in a multi-period master-slave nested ring array having concentric rings, which can overcome the shortcomings of the above technical solutions of conventional electromagnetic shielding optical windows, particularly the problem in the existing single-layer squared metal grid, single-layer ring grid, double-layer squared and ring grids that the stray light distribution caused by the high-order diffraction are relatively concentrated, and achieve the purposes of deeply homogenizing high-order diffraction and hardly affecting the imaging quality.

The present invention adopts the following technical solution: a multi-period master-slave nested ring array electromagnetic shielding optical window having concentric rings, characterized in that: the metal grid in the electromagnetic shielding optical window forms a basic structure of a two-dimensional grid by metal rings having the same diameter as basic rings closely-joining arranged according to a two-dimensional orthogonal arrangement, and is loaded on the surface of the optical window transparent substrate; adjacent basic rings are connected in an externally tangential manner; metal concentric sub-ring pairs are arranged within each basic ring, and external rings of the concentric sub-ring pairs as the sub-rings are connected with the basic rings in an internally tangential manner; the sub-ring has secondary sub-rings which are connected with the sub-ring in an internally tangential manner; the concentric sub-ring pair and the secondary sub-rings which are connected to it in an internally tangential manner together forms a sub-unit; a filling ring is arranged between adjacent sub-units and is connected with the sub-rings in the two adjacent sub-units in an externally tangential manner, and is also connected with the basic ring in which the sub-units are located, in an internally tangential manner; a basic ring, the sub-units in the basic ring and the filling rings together form a basic unit of the two-dimensional metal grid structure; a concentric modulation ring pair is arranged among the basic units, and an external ring of the concentric modulation ring pair as a modulation ring is connected with four adjacent two-dimensional orthogonal basic rings in an externally tangential manner, respectively; each modulation ring has modulation sub-rings therein which are connected with the modulation ring in an internally tangential manner; the concentric modulation ring pair and the modulation sub-rings therein together form a modulation basic unit; the diameters of the basic rings, the concentric sub-ring pairs, the secondary sub-rings, the filling rings, the concentric modulation ring pairs and the modulation sub-rings are in magnitudes of millimeter and submillimeter, and the metal line widths of the basic rings, the concentric sub-ring pairs, the secondary sub-rings, the filling rings, the concentric modulation ring pairs and the modulation sub-rings are in magnitudes of micron and sub-micron; the connection in an externally tangential manner includes the following cases: ① two rings are externally tangent and a connection metal for connecting two rings is provided at the external tangent point; ② lines at the junction of two rings are in seamless overlapping structure; and ③ lines at the junction of the two rings are in seamless overlapping structure, meanwhile a connection metal for connecting two rings is provided at the overlap; connection in an internally tangential manner includes the following cases: ① two rings are internally tangent and a connection metal for connecting two rings is provided at the internal tangent point; ② lines at the junction of two rings are in seamless overlapping structure, and ③ lines at the junction of two rings are in seamless overlapping structure, meanwhile a connection metal for connecting two rings is provided at the overlap.

In the multi-period master-slave nested ring array electromagnetic shielding optical window having concentric rings, the sub-rings in each basic unit are in a number of 2 or more and have the same or different diameters, and an included angle formed by connection lines between the circle centers of adjacent sub-rings and the circle center of the basic ring in which they are located is at any degree, and sub-rings in different basic units are equal-diameter or unequal-diameter rings and are the same or different in number; the secondary sub-rings in each sub-unit are in a number of 2 or more and have the same or different diameters; an included angle formed by connection lines between the circle centers of adjacent secondary sub-rings and the circle center of the sub-ring in which the adjacent secondary sub-rings are located is at any degree; the secondary sub-rings in different sub-units are equal-diameter or unequal-diameter rings and are the same or different in number; the modulation sub-rings in each modulation basic unit are in a number of 2 or more and have the same or different diameters, and an included angle formed by connection lines between the circle centers of adjacent modulation sub-rings and the circle center of the modulation ring in which the adjacent modulation sub-rings are located is at any degree, and the modulation sub-rings in different modulation basic units are equal-diameter or unequal-diameter rings and are the same or different in number.

In the multi-period master-slave nested ring array electromagnetic shielding optical window having concentric rings, a ratio of an inner diameter to an outer diameter of the concentric sub-ring pair is in a range of 0.2 to 0.8, and a ratio of an inner diameter to an outer diameter of the concentric modulation ring pair is in the range of 0.2 to 0.8; the ratios of the internal ring diameter to the external ring diameter of the concentric sub-ring pairs in different sub-units are the same or different, and the ratios of the internal ring diameter to the external ring diameter of the concentric modulation ring pairs in different modulation basic units are the same or different; adjacent sub-rings in the basic unit are connected in an externally tangential manner or are intersected with each other, and adjacent secondary sub-rings in the sub-unit are connected in an externally tangential manner or are intersected with each other, and the secondary sub-rings are tangentially connected or intersected with the internal ring of the concentric ring pair in the sub-unit in which the secondary sub-rings are located; adjacent modulation sub-rings in a modulation basic unit are connected in an externally tangential manner or are intersected with each other, and modulation sub-rings are tangentially connected or intersected with the internal ring of the concentric ring pairs in the modulation basic unit in which the modulation sub-rings are located; the tangential connection includes external tangential connection and internal tangential connection.

As a preferred structure, in the multi-period master-slave nested ring array electromagnetic shielding optical window having concentric rings, the diameters of the sub-rings in the basic unit are the same, and the included angles formed by the connection lines between the circle centers of adjacent sub-rings and the circle center of the basic ring are equal; the diameters of the secondary sub-rings in each sub-unit are the same; and the included angles formed by the connection lines between the circle centers of adjacent secondary sub-rings and the circle center of the sub-ring in which the adjacent secondary sub-rings are located are equal; the diameters of the modulation sub-rings in each modulation basic unit are the same; and the included angles formed by the connection lines between the circle centers of adjacent modulation sub-rings and the circle center of the modulation ring in which the adjacent modulation sub-rings are located are equal.

As a preferred structure, in the multi-period master-slave nested ring array electromagnetic shielding optical window having concentric rings, the sub-rings in different basic units are the same in number and equal in diameter; the secondary sub-rings in different sub-units are the same in number and equal in diameter; the modulation sub-rings in different modulation basic units are the same in number and equal in diameter.

As a preferred structure, in the multi-period master-slave nested ring array electromagnetic shielding optical window having concentric rings, the secondary sub-rings in different sub-units are at the same relative position, and are arranged in the basic ring after duplicating one sub-unit; the sub-units in different basic units are at the same relative position; the modulation sub-rings in different modulation basic units are at the same relative position, and one basic unit and one modulation basic unit are together duplicated and then closely-joining arranged according to a two-dimensional orthogonal arrangement to form a two-dimensional metal grid.

As a preferred structure, in the multi-period master-slave nested ring array electromagnetic shielding optical window having concentric rings, the secondary sub-rings in different sub-units in one basic unit are at different relative positions, and are arranged in the basic ring after duplicating one sub-unit, wherein any sub-unit with respect to other sub-units in the same basic ring rotates by a certain angle around the circle center of its sub-ring in a two-dimensional plane; in the same row, the sub-units in adjacent basic units are at different relative positions, the modulation sub-rings in adjacent modulation basic units are at different relative positions, and one basic unit and one modulation basic unit together are duplicated and then closely-joining arranged according to a two-dimensional orthogonal arrangement to form a two-dimensional metal grid, wherein any basic unit rotates by a certain angle around the circle center of its basic ring with respect to its adjacent basic unit in a two-dimensional plane, and any modulation basic unit rotates by a certain angle around the circle center of its modulation ring with respect to its adjacent modulation basic unit in a two-dimensional plane.

As a preferred structure, in the multi-period master-slave nested ring array electromagnetic shielding optical window having concentric rings, any basic unit with respect to its adjacent basic unit in the same row rotates by the same angle, and any modulation basic unit with respect to its adjacent modulation basic unit in the same row rotates by the same angle.

In the multi-period master-slave nested ring array electromagnetic shielding optical window having concentric rings, the basic rings, the concentric sub-ring pairs, the secondary sub-rings, the filling rings, the concentric modulation ring pairs, the modulation sub-rings and the connection metal are made of an alloy having good conductivity, and the alloy has a thickness of greater than 100 nm.

In the multi-period master-slave nested ring array electromagnetic shielding optical window having concentric rings, an adhesive layer is made of chromium or titanium material.

The inventiveness and the excellent effects of the present invention are as follows:

The metal grid in the electromagnetic shielding optical window is formed by metal rings having the same diameter as basic rings closely-joining arranged according to a two-dimensional orthogonal arrangement, forming a basic structure of a two-dimensional grid, and is loaded on the surface of the optical window transparent substrate; and adjacent basic rings are connected in an externally tangential manner. The inventiveness of the present invention lies in that: metal concentric sub-ring pairs are arranged within each basic ring, and external rings of the concentric sub-ring pairs are connected with the basic rings in an internally tangential manner as the sub-rings; each sub-ring has secondary sub-rings which are connected with the sub-ring in an internally tangential manner therein; a concentric sub-ring pair and the secondary sub-rings which are connected to it in an internally tangential manner together form a sub-unit; a filling ring is arranged between adjacent sub-units and is connected with the sub-rings in the two adjacent sub-units in an externally tangential manner, meanwhile is also connected with the basic ring in which the sub-units are provided, in an internally tangential manner; the basic rings, the sub-units in the basic rings and the filling rings together form basic units of a two-dimensional metal grid structure; a concentric modulation ring pair is provided among the basic units, and an external ring of the concentric modulation ring pair, as a modulation ring, is connected with four adjacent two-dimensional orthogonal basic rings in an externally tangential manner; each modulation ring has modulation sub-rings which are connected with the modulation ring in an internally tangential manner; the concentric modulation ring pair and the modulation sub-rings therein together form a modulation basic unit; the basic rings, the concentric sub-ring pairs, the secondary sub-rings, the filling rings, the concentric modulation ring pairs and the modulation sub-rings have the diameters in magnitudes of millimeter and submillimeter, and the metal line widths in magnitudes of micron and sub-micron; the connection in an externally tangential manner includes the following cases: ① two rings are externally tangent and a connection metal for connecting two rings is provided at the external tangent point; ② lines at the junction of two rings are in seamless overlapping structure; and ③ lines at the junction of the two rings are in seamless overlapping structure, meanwhile a connection metal for connecting two rings is provided at the overlap; connection in an internally tangential manner includes the following cases: ① two rings are internally tangent and a connection metal for connecting two rings is provided at the internal tangent point; ② lines at the junction of two rings are in seamless overlapping structure, an ③ lines at the junction of two rings are in seamless overlapping structure, meanwhile a connection metal for connecting two rings is provided at the overlap. The advantageous effect achieved by the inventiveness of the present invention mainly lies in homogenizing the energy distribution of the high-order diffraction of the metal grid, specifically as follows:

In the metal grid, the basic rings and the external and internal rings of the concentric modulation ring pairs are all arranged in a two-dimensional orthogonal arrangement as the basic arrangement manner, which can overcome the detect of concentrated energy distribution of the high-order diffraction in the traditional squared metal grid, thus having the characteristic of effectively homogenizing the energy distribution of high-order diffraction. Besides, by forming an array of metal rings by a manner of connecting a set of concentric modulation ring pair with four basic rings in an externally tangential manner, light transmittance can be guaranteed, and as compared with the structure having only unitary-diameter ring array, the diameter of each ring needs to be enlarged, which results in reduction of the high-order diffraction energy of each ring array and achieving the purpose of homogenizing the energy distribution of the high-order diffraction. This is the first reason why the metal grid of the present invention can homogenize the energy distribution of high-order diffraction.

Concentric sub-ring pairs are added in the basic ring to form basic units and modulation sub-rings are added in the concentric modulation ring pair to form modulation basic units, because the concentric sub-ring pairs in each basic unit and the modulation sub-rings in each modulation basic unit are different in number, diameter and position relations, resulting in a loose structure and stray arrangement. Thus, the high-order diffraction has low energy and is uniformly distributed, avoiding the situation where the high-order diffraction energy of the traditional squared metal grid is in concentrated distribution. Meanwhile, as the light transmittance is guaranteed, it is necessary to further increase the diameters of the basic rings and the modulation rings, thereby reducing the overall high-order diffraction energy of each array. Further, since there is little chance that the high-order diffraction generated by the concentric sub-ring array structure and the modulation sub-ring array structure overlaps with the high-order diffraction of the basic ring array structure and the modulation ring array structure, and their high-order diffractions with high energy are not superposed after further optimization of the parameters such as the number, diameter and position of the sub-rings, energy distribution of the high-order diffraction is homogenized. This is the second reason why the metal grid of the present invention can homogenize energy distribution of the high-order diffraction.

Regarding the array of the internal rings of the concentric sub-ring pairs and the array of the internal rings of the concentric modulation ring pairs, since the diameters of the internal rings are relatively small and the spaces therebetween are comparatively large, their high-order diffraction energy is relatively small and the high-order diffraction distribution is relatively uniform; meanwhile, by changing the ratio of the inner diameter to the outer diameter of the concentric ring pairs, it can effectively and optimally adjust the maximum relative intensity of the high-order diffraction and further homogenize the entire energy distribution of the high-order diffraction of the metal grid array structure. This is the third reasons why the metal grid of the present invention can homogenize energy distribution of the high-order diffraction.

By adding secondary sub-rings in a concentric sub-ring pair to form a sub-unit, introducing a filling ring between two sub-units, and reforming the basic ring, the sub-unit and the filling ring into a basic unit, it can guarantee the light transmittance, and meanwhile it needs to further increase the diameters of the basic ring and the concentric sub-ring pairs in the basic unit, as compared with the structure having only the basic rings and the concentric sub-ring pairs, thereby entirely reducing the high-order diffraction energy of each array. Furthermore, since there is little chance that the high-order diffraction of the secondary sub-rings and that of other ring array structures overlap, and in particular, their high-order diffractions with higher energy are not superposed after optimization of the structure and the parameters, energy distribution of the high-order diffraction is homogenized. This is the fourth reason why the metal grid of the present invention can homogenize energy distribution of the high-order diffraction.

Each sub-unit can rotate by a certain angle with the circle center of its sub-ring as the center, each basic unit can rotate by a certain angle with the circle center of its basic ring as the center, and each modulation basic unit can rotate by a certain angle with the circle center of its modulation ring as the center, which do not change the aperture ratio of the metal grid and thus does not affect the light transmittance. Yet, it is possible to further modulate the energy distribution of the high-order diffraction, thereby further homogenizing the energy distribution of high-order diffraction. This is the fifth reason why the metal grid of the present invention can homogenize the energy distribution of high-order diffraction.

In summary, the metal grid structure of the present invention can achieve thorough homogenization of the energy distribution of high-order diffraction of the grid, which is the most outstanding effect of the present invention in addition, adding concentric sub-ring pairs in the basic ring structure, adding secondary sub-rings in the concentric sub-ring pairs, introducing the filling rings among sub-rings, and adding modulation sub-rings in the concentric modulation ring pairs all effectively improve the uniformity of the metal ring grid structure. Further, when the sub-unit rotates by a certain angle with the circle center of its sub-ring as the center, the basic unit rotates by a certain angle with the circle center of is basic ring as the center, and the modulation basic unit rotates by a certain angle with the circle center of its modulation rings as the center, the uniformity of the metal grid structure will not be changed, so it can effectively modulate the energy distribution of the high-order diffraction, and meanwhile the electromagnetic shielding effect is substantially not affected, and is even improved in some preferred solutions.

Figure 1:
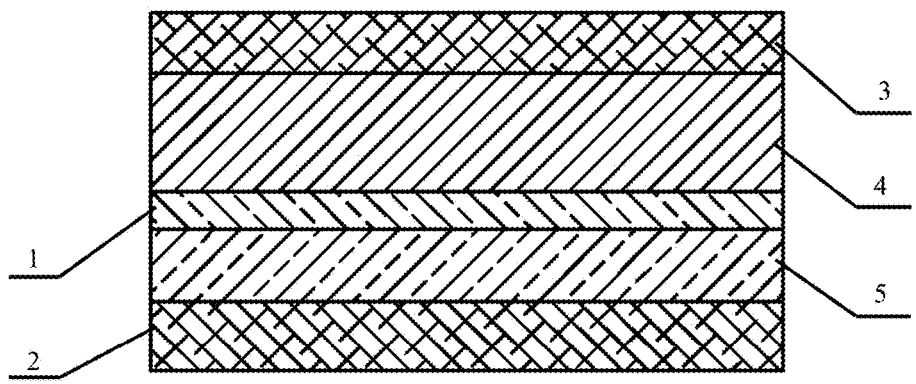
FIG. 1 is a schematic sectional view of a preferred structure of the multi-period master-slave nested ring array electromagnetic shielding optical window having concentric rings.

Description of part numbers in the drawings: 1. An adhesive layer; 2. A protective layer; 3. Antireflection film; 4. Transparent substrate; 5. Metal grid; 6. Basic rings; 7. Sub-rings; 8. Secondary sub-rings; 9. Filling rings; 10. Modulation rings; 11. Modulation sub-rings; 12. Connection metal

SPECIFIC EMBODIMENTS

The present invention is further described referring to the figures and preferred embodiments.

The present invention relates to a multi-period master-slave nested ring array electromagnetic shielding optical window having concentric rings. In the electromagnetic shielding optical window, the metal grid 5 is formed by closely-joining arranging metal rings having the same diameter as basic rings 6 according to a two-dimensional orthogonal arrangement to forming a basic structure of a two-dimensional grid, and is loaded on the surface of the optical window transparent substrate; adjacent basic rings 6 are connected in an externally tangential manner; metal concentric sub-ring pairs are arranged within each basic ring 6, and the external rings of the concentric sub-ring pairs, as the sub-rings 7, are connected with the basic rings 6 in an internally tangential manner; each sub-ring 7 has secondary sub-rings 8 therein which are connected with the sub-ring 7 in an internally tangential manner; the concentric sub-ring pair and the secondary sub-rings 8 which are connected to it in an internally tangential manner together form a sub-unit; a filling ring 9 is arranged between adjacent sub-units and is connected with the sub-rings 7 in two adjacent sub-units in an externally tangential manner, meanwhile is also connected with the basic ring 6 in which the sub-units are located, in an internally tangential manner; the basic ring 6, the sub-units in the basic ring 6 and the filling ring 9 together form a basic unit of a two-dimensional metal grid structure; a concentric modulation ring pair is arranged among the basic units; and an external ring of the concentric modulation ring pair, as a modulation ring 10, is connected with four adjacent two-dimensional orthogonal basic rings 6; respectively; in an externally tangential manner; each modulation ring 10 has modulation sub-rings 11 which are connected with the modulation ring in an internally tangential manner; the concentric modulation ring pair and the modulation sub-rings 11 therein together form a modulation basic unit; the basic rings 6, the concentric sub-ring pairs, the secondary sub-rings 8, the filling rings 9, the concentric modulation ring pairs and the modulation sub-rings 11 have diameters in magnitudes of millimeter and submillimeter, and metal line widths in magnitudes of micron and sub-micron; the connection in an externally tangential manner includes the following cases: ① two rings are externally tangent and a connection metal 12 for connecting two rings is provided at the external tangent point; ② lines at the junction of two rings are in seamless overlapping structure; and ③ lines at the junction of the two rings are in seamless overlapping structure, and a connection metal 12 for connecting two rings is provided at the overlap; connection in an internally tangential manner includes the following cases: ① two rings are internally tangent and a connection metal 12 for connecting two rings is provided at the internal tangent point; ② lines at the junction of two rings are in seamless overlapping structure, and ③ lines at the junction of two rings are in seamless overlapping structure, meanwhile a connection metal 12 for connecting two rings is provided at the overlap.

Figure 2:
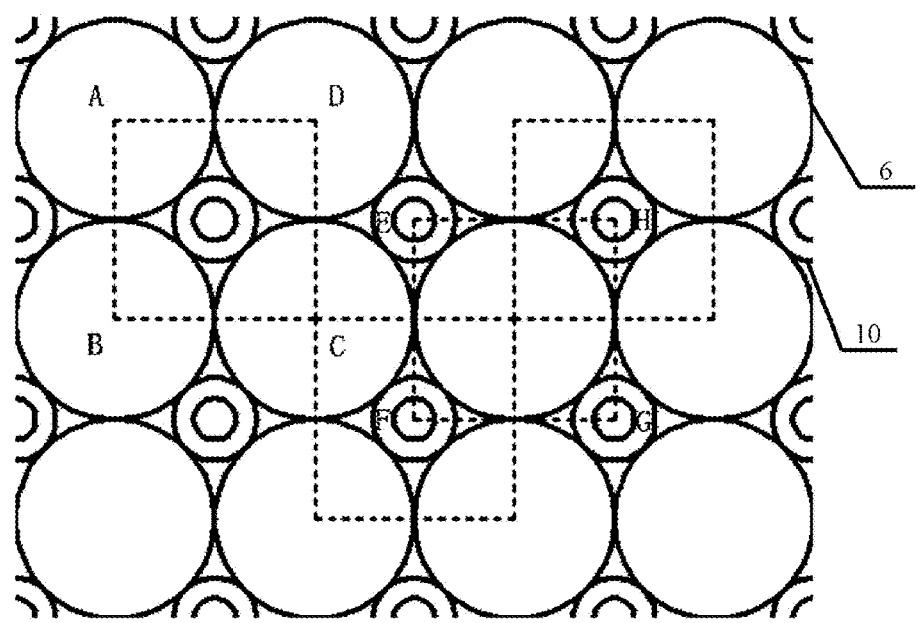
FIG. 2 is a schematic view of the distribution of the basic rings and the concentric modulation ring pairs of the multi-period master-slave nested ring array electromagnetic shielding optical window having concentric rings.

In the multi-period master-slave nested ring array electromagnetic shielding optical window having concentric rings of the present invention, metal rings having the same diameter acting as basic rings 6 are closely-joining arranged according to a two-dimensional orthogonal distribution arrangement to form a basic structure of the grid and is loaded on the surface of an optical window transparent substrate; adjacent basic rings 6 are connected in an externally tangential manner, a concentric modulation ring pair is arranged among basic units, and an external ring of the concentric modulation ring pair, as a modulation ring 10, is connected with four adjacent two-dimensional orthogonal basic rings 6, respectively, in an externally tangential manner. The distribution of the basic rings 6 and the concentric modulation ring pairs is shown in FIG. 2. Points A, B, C and D in FIG. 2 are circle centers of four adjacent two-dimensional orthogonal basic rings 6, and points F. F. G and 11 are circle centers of four modulation rings 10 which are connected with the same basic ring 6 in an externally tangential manner. The quadrangles ABCD and EFGH are both square. Such arrangement can ensure that all the basic rings 6 and the concentric modulation ring pairs are closely-joining arranged according to a two-dimensional orthogonal distribution to form the metal grid 5.

In the multi-period master-slave nested ring array electromagnetic shielding optical window having concentric rings of the present invention, diameters of the basic rings 6, the concentric sub-ring pairs, the secondary sub-rings 8, the filling rings 9, the concentric modulation rings and the modulation sub-rings 11 are in magnitudes of millimeter and sub-millimeter, and the metal line widths of the basic rings 6, the concentric sub-ring pairs, the secondary sub-rings 8, the filling rings 9, the concentric modulation rings and the modulation sub-rings 11 are in magnitudes of micron and submicron, so as to ensure high light transmittance and good electromagnetic shielding effect. In addition, each ring portion and the connection metal are made of metals having good conductivity, such as gold, silver, copper, aluminum and other pure metals and metal alloys, and the thickness of the metal is greater than 100 nm.

Figure 3:
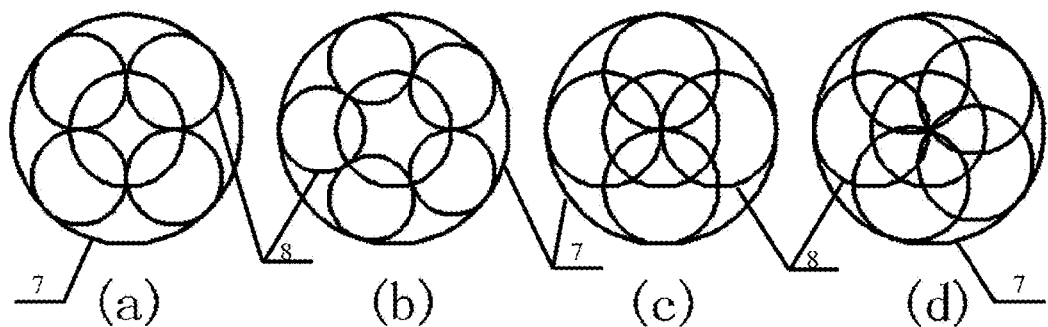
FIG. 3 is a schematic view of typical sub-units of the multi-period master-slave nested ring array electromagnetic shielding optical window having concentric rings.

In the multi-period master-slave nested ring array electromagnetic shielding optical window having concentric rings of the present invention, the sub-rings 7 in each basic unit are in a number of two or more and have the same or different diameters, and the included angle formed by connection lines between the circle centers of adjacent sub-rings 7 and the circle center of the basic ring 6 is at any degree. The sub-rings 7 in different basic units are equal-diameter or unequal-diameter rings and are in the same or different numbers; the secondary sub-rings 8 in each sub-unit are in a number of 2 or more and have the same or different diameters; an included angle formed by connection lines between the circle centers of adjacent secondary sub-rings 8 and the circle center of the sub-ring 7 in which they are located is at any degree; the secondary sub-rings 8 in different sub-units are equal-diameter or unequal-diameter rings and are the same or different in number; the modulation sub-rings 11 in each modulation basic unit are in a number of 2 or more and have the same or different diameters, and an included angle formed by connection lines between the circle centers of adjacent modulation sub-rings 11 and the circle center of the modulation ring 10 in which the adjacent modulation sub-rings 11 are located is at any degree, and the modulation sub-rings 11 in different modulation basic units are equal-diameter or unequal-diameter rings and are the same or different in number; adjacent sub-rings 7 in the basic unit are connected in an externally tangential manner or are intersected with each other, and adjacent secondary sub-rings 8 in the sub-unit are connected in an externally tangential manner or are intersected with each other, and the secondary sub-rings 8 are tangentially connected or intersected with the internal ring of the concentric ring pair in the sub-unit in which they are located; adjacent modulation sub-rings 11 in a modulation basic unit are connected in an externally tangential manner or are intersected with each other, and modulation sub-rings 11 are tangentially connected or intersected with the internal ring of the concentric ring pair in the modulation basic unit in which they are located; the tangential connection includes external tangential connection and internal tangential connection. FIG. 3 illustrates a schematic view of preferred structure of a sub-unit consisting of a sub-ring 7 and secondary sub-rings S. In FIG. 3, the secondary sub-rings 8 in the sub-unit have the same diameter, and the included angles formed by the connection lines between the circle centers of adjacent secondary sub-rings 8 and the circle center of the sub-ring in which the adjacent secondary sub-rings 8 are located are equal. FIGS. 3(a) and 3(b) illustrate that the secondary sub-rings 8 having the same diameter in the sub-unit are connected in an externally tangential manner meanwhile are also intersected with the internal ring of the concentric sub-ring pair; FIGS. 3(c) and 3(d) illustrate that the secondary sub-rings 8 having the same diameter in the sub-unit are connected in intersection meanwhile are also intersected with the internal ring of the concentric sub-ring pair. The modulation basic units and the sub-units are similar in structure, so the structures shown in FIG. 3 may also be used to illustrate the relation between the modulation ring 10 and the modulation sub-rings 11.

Figure 4:
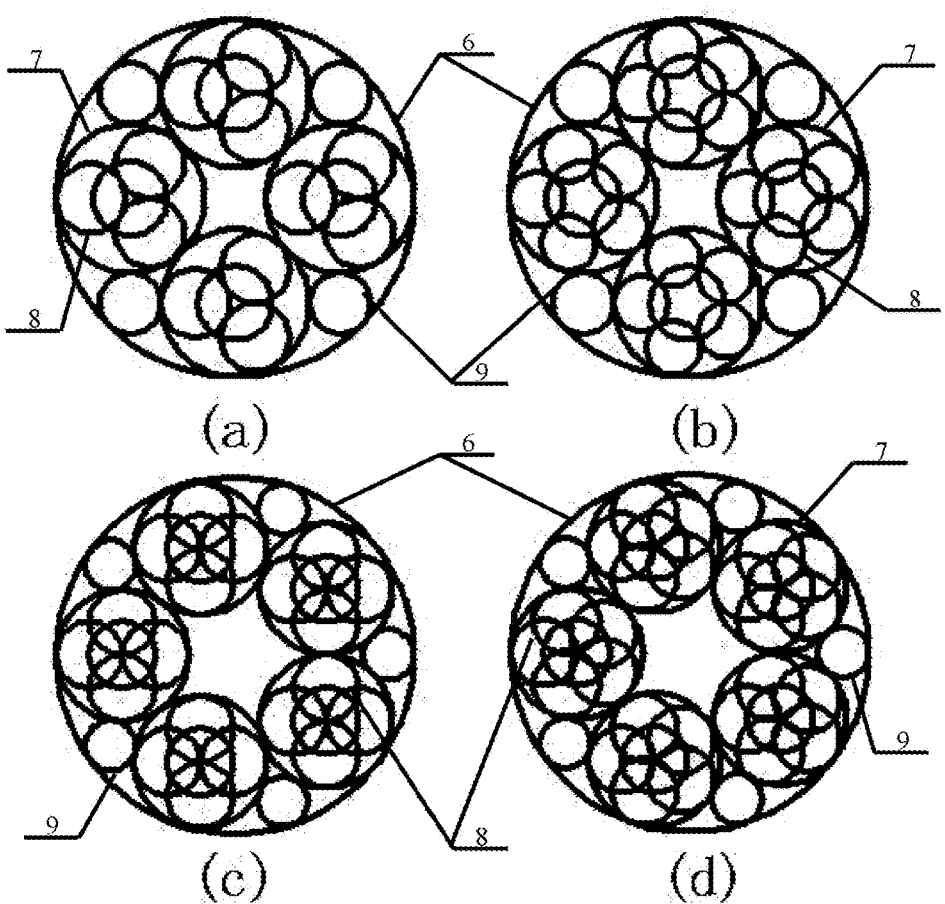
FIG. 4 is a schematic view of typical basic units of the multi-period master-slave nested ring array electromagnetic shielding optical window having concentric rings.

In a multi-period master-slave nested ring array electromagnetic shielding optical window having concentric rings, the metal grid 5 in the electromagnetic shielding optical window is formed by closely-joining arranging metal rings having the same diameter as basic rings 6 according to a two-dimensional orthogonal arrangement to form a basic structure of a two-dimensional grid; adjacent basic rings 6 are connected in an externally tangential manner; metal concentric sub-ring pairs are arranged within each basic ring 6, and the external rings of the concentric sub-ring pairs, as the sub-rings 7, are connected with the basic rings 6 in an internally tangential manner; each sub-ring 7 has secondary sub-rings 8 therein which are connected with the sub-ring 7 in an internally tangential manner; the concentric sub-ring pair and the secondary sub-rings 8 which are connected to it in an internally tangential manner together forms a sub-unit; a filling ring 9 is arranged between adjacent sub-units and is connected with the sub-rings 7 in two adjacent sub-units in an externally tangential manner, meanwhile is also connected with the basic ring 6 in which the sub-units are located, in an internally tangential manner; the basic rings 6, the sub-units in the basic rings 6 and the filling rings 9 together form a multi-period master-slave nested ring structure having concentric rings, constructing basic units of a two-dimensional grid array structure. Several typical structures of the basic units are shown in FIG. 4, in which all the sub-rings 7 in the basic units are connected in an externally tangential manner; in FIGS. 4(a) and (b) the sub-rings are in a number of 4, and the secondary sub-rings 8 having the same diameter in the sub-unit are connected in an externally tangential manner meanwhile are also intersected with the internal ring of the concentric sub-ring pair; in FIGS. 4(c) and (d), the sub-rings are in a number of 5, and the secondary sub-rings 8 having the same diameter in the sub-unit are connected in intersection meanwhile are also intersected with the internal ring of the concentric sub-ring pair.

Figure 5:
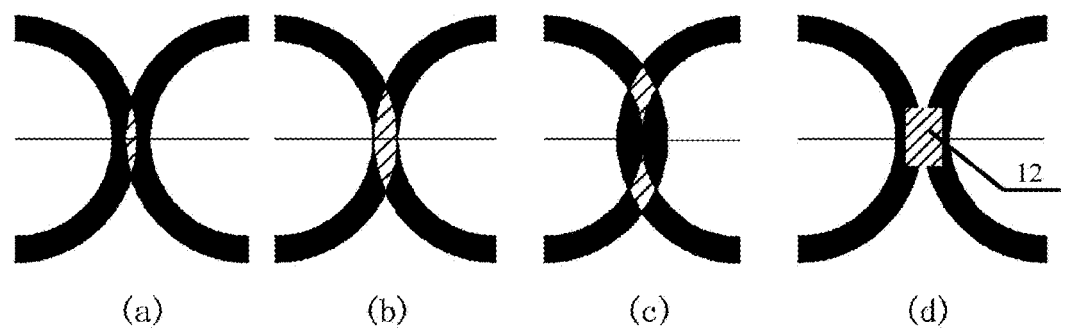
FIG. 5 is a schematic view of the externally tangential manners in which two rings are connected.
Figure 6:
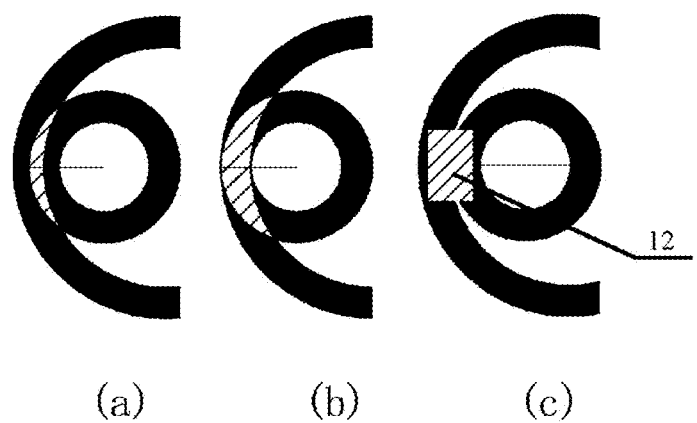
FIG. 6 is a schematic view of the internally tangential manners in which two rings are connected.

FIGS. 5 and 6 respectively show that the two rings are connected in an externally tangential manner or in an internally tangential manner, and by overlapping lines or providing (such as covering) a metal for ensuring reliable electrical connection between the tangent points of the metal rings, it is ensured that the tangential metal rings are closely-joining connected and electrically conductive therebetween. FIGS. 5(a), 5(b) and 5(c) respectively illustrate the schematic views that the two rings are in seamless overlapping structure when being connected in an externally tangential manner: FIG. 5 (a) is a general case of the two rings being seamless overlapped; namely, the circle center distance of two rings is smaller than the circle center distance of the two rings being externally tangent, and larger than the difference between the circle center distance of two rings being externally tangent and a sum of the line widths of the two rings. FIG. 5(b) is special case of two rings being seamless overlapped, wherein the inner and outer contours of the lines of the two rings are mutually externally tangent. FIG. 5(c) is another special case of two rings being seamless overlapped, wherein the circle center distance of two rings is equal to the difference between the circle center distance of two rings being externally tangent and a sum of the line widths of the two rings; namely, the inner contours of the lines of the two rings are externally tangent. In FIG. 5(d), because two rings are externally tangent, it is necessary to provide a metal at the tangent points, so as to ensure reliable electrical connection between the tangent points of the metal rings. FIGS. 6(a) and 6(b) respectively illustrate the schematic views that two rings are in seamless overlapping structure when being connected in an internally tangential manner: FIG. 6(a) shows a general case of two rings being seamless overlapped when being connected in an internally tangential manner; namely, the circle center distance of two rings is larger than the circle center distance of the two rings being internally tangent, and smaller than the sum of the circle center distance of two rings being internally tangent and the line width of the ring having larger diameter. FIG. 6(b) shows a special case of two rings being seamlessly overlapped when being connected in an internally tangential manner, wherein the circle center distance of two rings equals to the sum of the circle center distance of the two rings being internally tangent and the line width of the ring having a lager diameter; namely, the outer contours of the lines of the two rings are internally tangent. FIG. 6(c) shows that the outer contour of the line of the ring having a smaller diameter is internally tangential with the inner contour of the line of the ring having a larger diameter. In this case, it is necessary to provide a metal at the tangent points to ensure reliable electrical connection between the tangent points of the metal rings. In addition, when the two rings are seamlessly overlapped, if the overlapping area between two metal rings is too small to ensure reliable electrical connection between two metal rings, it is also necessary to provide a metal at the tangent points so as to ensure reliable electrical connection between the tangent points of the two metal rings, and further guarantee implementation of the metal rings' connection in an internally or externally tangential manner therebetween. FIGS. 5(d) and 6(c) show preferred metal connection manners at the tangent points, and the connection metal 12 covering at the tangent points is rectangular-shaped, and the edge length of the rectangle is larger than the line width of the metal rings. When a rectangle is used for covering the tangent points-connection area, one edge of the rectangle should fall entirely within the line of one metal ring, and its opposite edge should fall entirely in the line of another metal ring tangent to it. According to different processing methods and technique levels, other forms of connection metal may be used at the tangent points of the rings, as long as it enables the two tangent metal rings to have reliable electrical connection therebetween.

Figure 7:
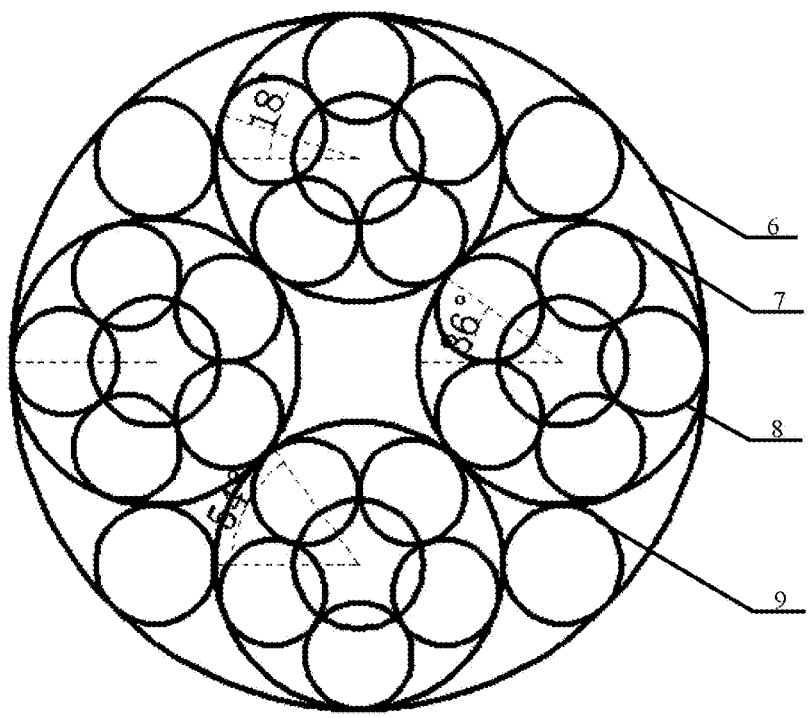
FIG. 7 is a schematic view of a rotation manner of the sub-unit with respect to other sub-units in the same basic ring of the present invention.
Figure 8:
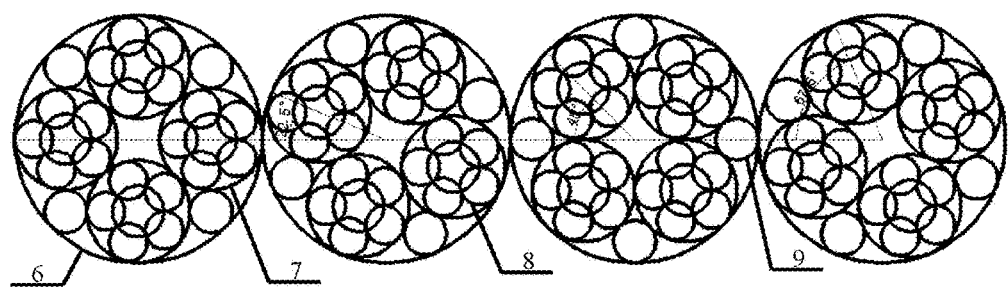
FIG. 8 is a schematic view of a rotation manner of the basic unit with respect to the adjacent basic unit in the present invention.

In the present invention, in order to achieve the purpose of homogenizing the stray light caused by high-order diffraction, a typical solution is adopted as follows: sub-rings 7 in the basic unit have the same diameter, and the included angle formed by the connections lines between the circle centers of adjacent sub-rings 7 and the circle center of the basic ring 6 are equal; secondary sub-rings 8 in the sub-unit have the same diameter, and the included angle formed by the connections lines between the circle centers of adjacent secondary sub-rings 8 and the circle center of the sub-ring 7 in which they are located are equal; modulation sub-rings 11 in the modulation basic unit have the same diameter, and the included angle formed by the connections lines between the circle centers of adjacent modulation sub-rings 11 and the circle center of the modulation ring 10 in which they are located are equal. On the basis of the above solution, as a preferred solution, the sub-rings 7 in different basic units are the same in number and equal in diameter; the secondary sub-rings 8 in different sub-units are the same in number and equal in diameter; the modulation sub-rings 11 in different modulation basic units are the same in number and equal in diameter. As a special example of such preferred solution, the relative positions of the secondary sub-rings 8 in different sub-units are the same, and are arranged in the basic unit 6 after duplicating one sub-unit; the relative positions of the sub-units in different basic units are the same, and the relative positions of the modulation sub-rings 11 in different modulation basic units are the same, one basic unit and one modulation basic unit are duplicated and then respectively arranged closely-joining according to an orthogonal arrangement to form a two-dimensional metal grid together. In order to achieve good effect of homogenizing stray light caused by the high-order diffraction, as another special example of such preferred solution, the secondary sub-rings 8 in different sub-units of the same basic unit in the metal grid array of the present invention are in different relative positions, and are arranged in the basic ring 6 after duplicating one sub-unit, wherein any sub-unit rotate by a certain angle around the circle center of its own sub-ring 7 with respect to the other sub-units in the same basic ring 6 in a two-dimensional plane; in the same row; sub-units in adjacent basic units are in different relative positions, and the modulation sub-rings 11 in adjacent modulation basic units are at different relative positions; and one basic unit and one modulation basic unit are duplicated and then are closely-joining arranged according to a two-dimensional orthogonal arrangement to form a two-dimensional grid array, wherein any basic unit rotates by a certain angle around the circle center of its own basic ring 6 with respect to its adjacent basic unit in a two-dimensional plane; and any modulation basic unit rotates by a certain angle around the circle center of its own modulation ring 10 with respect to its adjacent modulation basic unit in a two-dimensional plane; any basic unit in the same row rotates by the same angle with respect to the adjacent basic unit and any modulation basic unit in the same row rotates by the same angle with respect to the adjacent modulation basic unit. For example, FIG. 7 illustrates a schematic view of the rotation of one sub-unit with respect to other sub-units in the same basic ring, FIG. 8 illustrates a schematic view of the rotation manner of a basic unit with respect to its adjacent basic unit, wherein the basic unit of the metal grid employs the structure shown in FIG. 4(b), the rotation angle of the sub-unit is 18°, and each basic unit with respect to its adjacent basic unit in the same row sequentially rotates by an angle of 22.5°.

Figure 9:
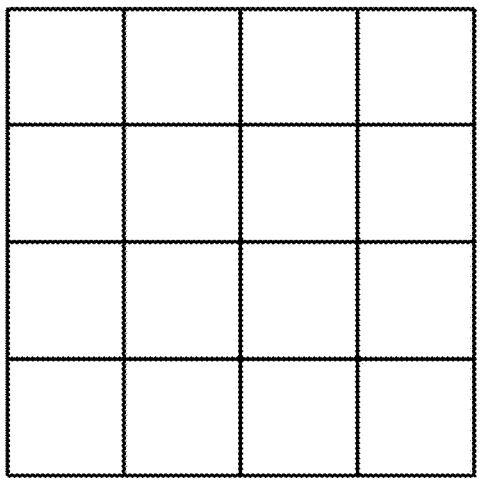
FIG. 9 is a schematic view of the structure of an existing squared grid.
Figure 10:
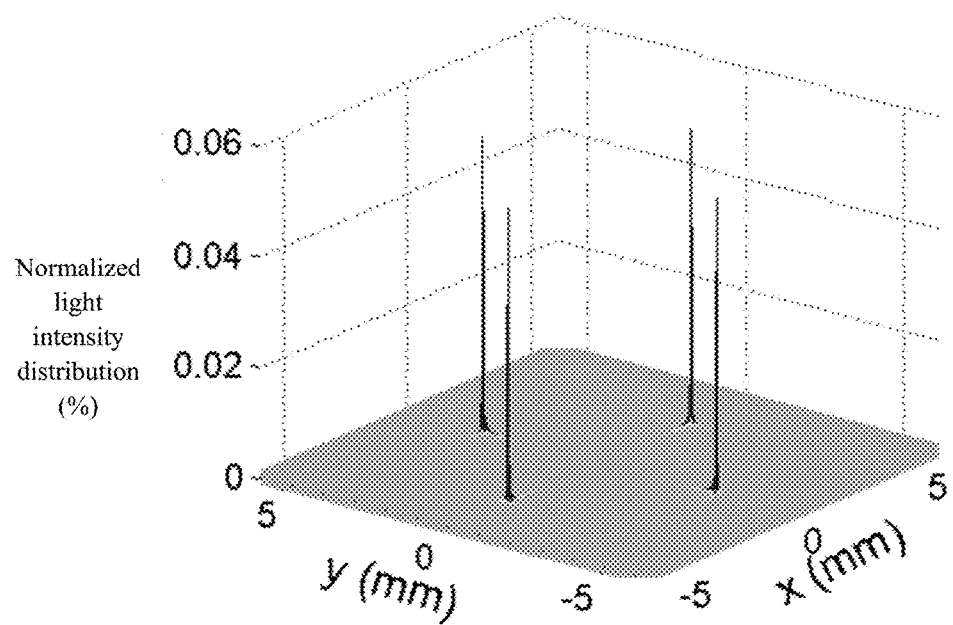
FIG. 10 is a schematic view of the high-order diffraction and relative intensity distribution of an existing squared grid.
Figure 11:
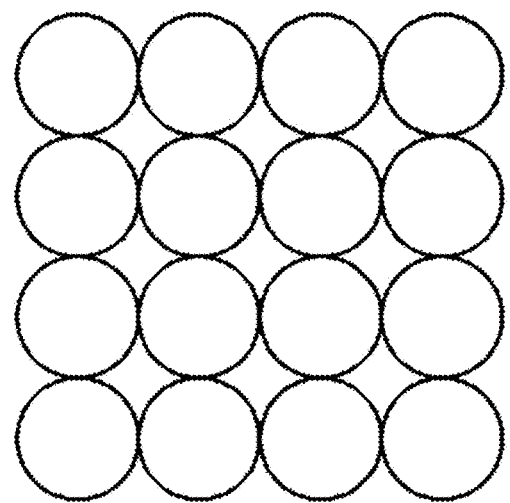
FIG. 11 is a schematic view of the structure of an existing ring grid.
Figure 12:
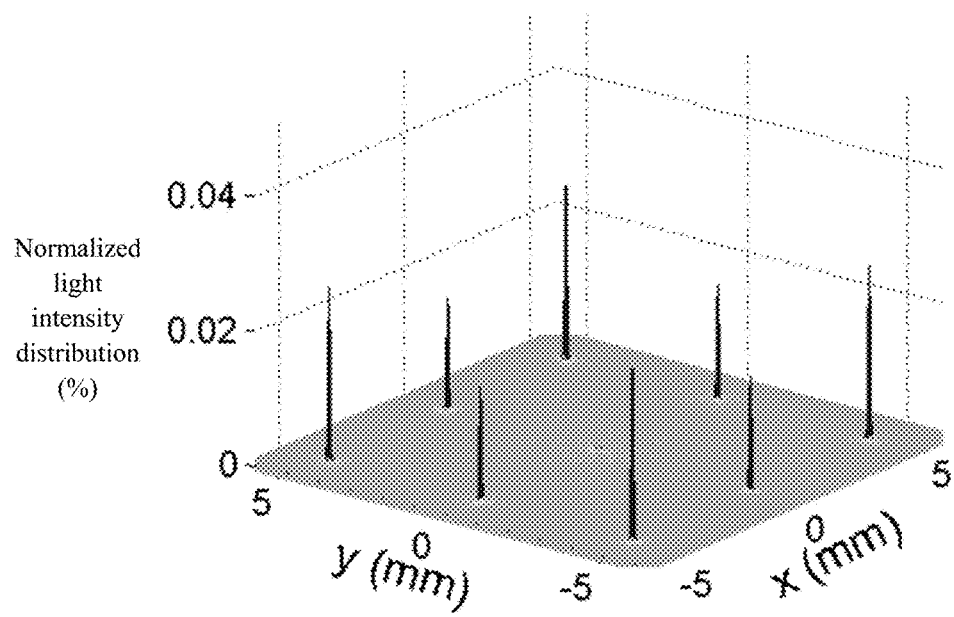
FIG. 12 is a schematic view of the high-order diffraction and its relative intensity distribution of an existing ring grid.
Figure 13:
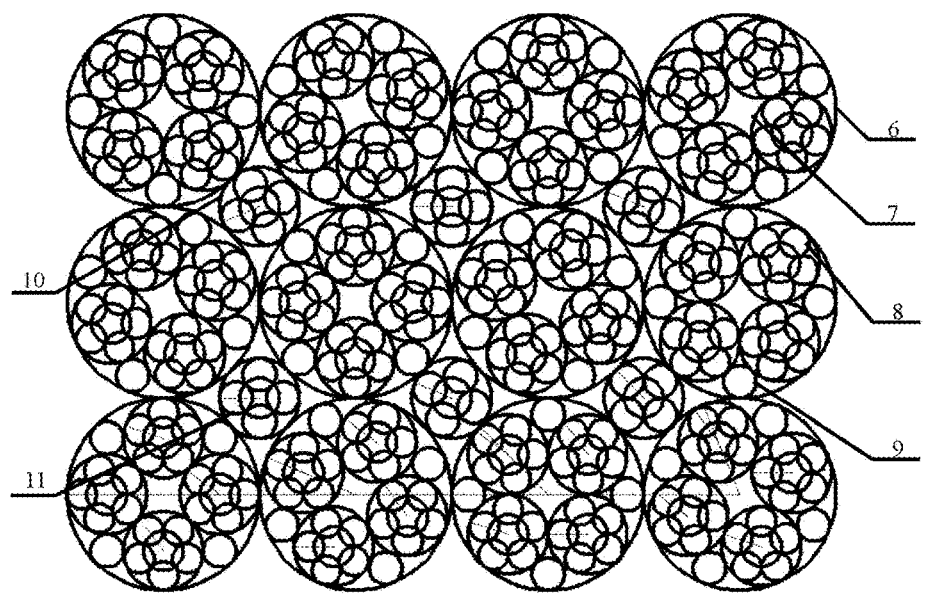
FIG. 13 is a schematic view of the structure of a metal grid in the preferred solution A of the present invention.
Figure 14:
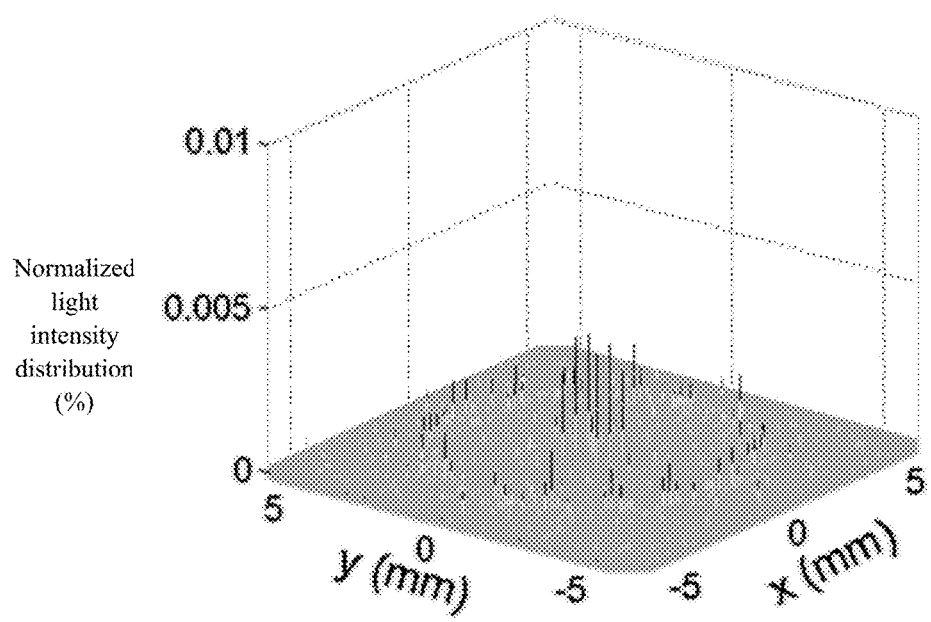
FIG. 14 is a schematic view of the high-order diffraction and its relative intensity distribution of the metal grid in the preferred solution A of the present invention.

FIG. 9 and FIG. 10 are respective schematic views of the existing squared grid structure and the distribution of its high-order diffraction and the relative intensity thereof in U.S. Pat. No. 4,871,220. FIG. 11 and FIG. 12 are respective schematic views of the existing ring grid structure and the distribution of its high-order diffraction and the relative intensity thereof in the Patent No. 200610010066.4. FIG. 13 and FIG. 14 are respective schematic views of the structure of the metal grid and the distribution of its high-order diffraction and the relative intensity thereof in the preferred solution A of the present invention. The metal grid in the preferred solution A employs the structure in FIG. 4 (b) as the basic unit, employs the structure in FIG. 3(a) as the modulation basic unit, and employs the rotation manner shown in FIG. 7 and FIG. 8 for rotating, the rotation angle among sub-units being 18°, each basic unit sequentially rotates by an angle of 22.5° with respect to the adjacent basic units in the same row, and each modulation basic unit sequentially rotates by an angle of 22.5° with respect to the adjacent modulation basic units in the same row.

Figure 15:
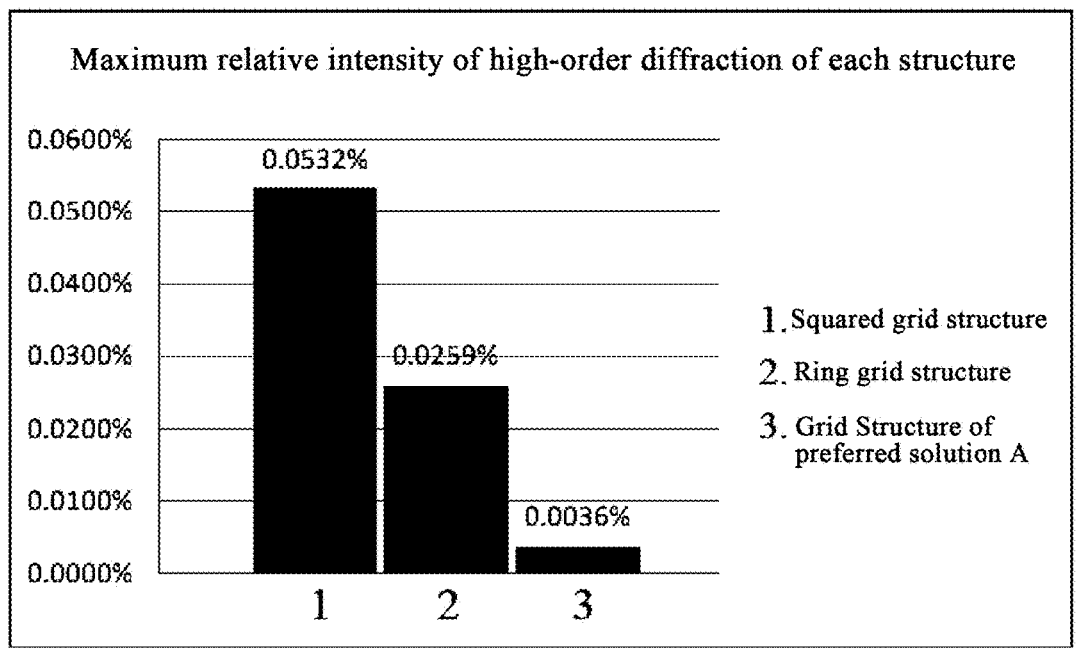
FIG. 15 is a comparison chart of the maximum relative intensity of the high-order diffraction of the three kinds of grid structures.

In order to illustrate the superiority of the present invention in homogenizing energy distribution of the high-order diffraction, the high-order diffraction energy distribution and the maximum relative intensity of the high-order diffraction of the above three structures are theoretically calculated based on the scalar diffraction theory, in which the light transmittance of each structure is the same (i.e. 95.4%), and the zero-order relative intensity thereof is each 91%; that is, the ratios of the useful information for imaging are the same. As compared with the squared and ring grid, the metal grid structure in the preferred solution A has obviously reduced relative intensity of the highest-order diffraction and noticeably increased number of the high-order diffraction spots in the same detection region, thereby avoiding the problem of high-order diffraction energy being concentrated on a few diffraction orders and allowing the high-order diffraction energy distribution to be more uniform. FIG. 15 shows the specific values of the maximum relative intensity of the high-order diffraction of the above three structures. It can be seen that the maximum relative intensity of the high-order diffraction of the squared metal grid structure is significantly higher than that of other structures. The maximum relative intensity of the high-order diffraction of the metal grid structure, to which the preferred solution A of the present invention corresponds, has been significantly reduced from 0.0259% (the maximum relative intensity of the high-order diffraction of the existing ring grid structure) to 0.0036%, i.e. by 86%, so the homogenizing effect of high-order diffraction is remarkable. In sum, the metal grid structure of the present invention has remarkable effect of homogenizing the high-order diffraction energy distribution, which is not only superior to that of the squared metal grid structure existing in the U.S. Pat. No. 4,871,220, but also superior to that of the existing ring metal grid structure in the Patent No. 200610010066.4.

The composition manner of the present invention allows the meshes to be relatively uniform. Particularly the metal grid structure described in the preferred solution, it achieves good light transmittance and shielding properties meanwhile deeply homogenizing the high-order diffraction energy distribution. It can improve the defect of the contradiction between light transmittance and shielding efficiency, when used for constructing a double-layer metal grid structure. Meanwhile, since the single-layer structure of the present invention can deeply homogenize the high-order diffraction energy distribution, it can also solve the problem in the existing double-layer metal grid structure that it cannot further homogenize the high-order diffraction energy distribution due to the limitation of the single-layer grid structure.

In the multi-period master-slave nested ring array electromagnetic shielding optical window having concentric rings of the present invention, the metal grid can be manufactured by using the following processing methods: producing a mask by means of electron beam direct writing; plating chrome or titanium on the optical window transparent substrate after cleaning it, to form an adhesive layer, on which the metallic film is then plated and a photoresist is coated for performing photoetching by using the processed mask; and finally performing dry or wet etching, and obtaining the grid pattern after stripping of photoresist. The metal grid pattern of a multi-period master-slave nested ring array having concentric rings may also be produced by omitting the mask production process, instead, by directly using a method of laser direct writing. Other microelectronic machining processes or binary optical element manufacturing processes, etc. can also be used for producing the metal grid structure of the present invention.

The transparent substrate 4 to which the present invention relates is determined by the practical application occasions, and may be made of ordinary glass, quartz glass, infrared materials, and transparent resin materials and so on. The respective metal ring structures of the present invention will be formed by adopting proper machining process according to the transparent substrate 4, so that they can be applied completely on the transparent substrate 4, and can realize reliable electrical connection or sealing with the window frame, etc., so as to guarantee excellent electromagnetic shielding function. In practical application, the surface of the transparent substrate 4 attached with a grid structure in the present application can be plated with an antireflection film to increase light transmission capability, or a protective layer is plated on the surface of the grid layer to not only prevent the metal structure from being corroded or oxidized due to long-term explosion in the art and causing reduction in shielding capability, but also present the grid layer from being scratched, worn or other damages.

The invention claimed is:

1. A multi-period master-slave nested ring array electromagnetic shielding optical window having concentric rings, wherein:

a metal grid in the electromagnetic shielding optical window forms a basic structure of a two-dimensional grid by closely arranging metal rings having a same diameter as basic rings according to a two-dimensional orthogonal arrangement and is loaded on a surface of an optical window transparent substrate, wherein adjacent basic rings are connected in an externally tangential manner; wherein:

metal concentric sub-ring pairs are arranged within each basic ring and the external rings of the concentric sub-ring pairs, as sub-rings, are connected with a respective basic ring in an internally tangential manner;

a sub-ring has secondary sub-rings therein which are connected with the sub-ring in an internally tangential manner;

the concentric sub-ring pairs and the secondary sub-rings which are connected to it in an internally tangential manner together form a sub-unit;

a filling ring is arranged between adjacent sub-units, connected with the sub-rings in two adjacent sub-units in an externally tangential manner, and also connected with the basic ring in which the sub-units are located in an internally tangential manner;

the basic ring, the sub-units in the basic ring, and the filling rings together form a basic unit of the two-dimensional grid;

a concentric modulation ring pair is arranged among basic units and the external ring of the concentric modulation ring pair, as a modulation ring, is connected with four adjacent two-dimensional orthogonal basic rings, respectively, in an externally tangential manner;

each modulation ring has modulation sub-rings which are connected with the modulation ring in an internally tangential manner;

the concentric modulation ring pair and the modulation sub-rings therein together form a modulation basic unit;

diameters of the basic rings, the concentric sub-ring pairs, the secondary sub-rings, the filling rings, the concentric modulation ring pairs, and the modulation sub-rings are in magnitudes of millimeters and sub-millimeters and metal line widths of the basic rings, the concentric sub-ring pairs, the secondary sub-rings, the filling rings, the concentric modulation ring pairs, and the modulation sub-rings are in magnitudes of microns and sub-microns; and connections in the externally tangential manner include:

two rings being arranged externally tangent to each other and a connection metal for connecting the two rings being located at an external tangent point;

lines at the junction of two rings arranged in a seamless overlapping structure; and lines at the junction of two rings arranged in a seamless overlapping structure, while a connection metal for connecting two rings is located at the overlap;

connections in the internally tangent manner include:
two rings being arranged internally tangent to each other and a connection metal for connecting two rings is located at an internal tangent point;
lines at the junction of two rings arranged in a seamless overlapping structure, and
lines at the junction of two rings arranged in a seamless overlapping structure, while a connection metal for connecting two rings is located at the overlap.

2. The optical window according to claim 1, wherein:
the sub-rings in each basic unit are in a number of two or more and have a same or different diameters and an included angle formed by connection lines between circle centers of adjacent sub-rings and a circle center of the basic ring in which the sub-rings are located is at any degree;
the sub-rings in different basic units are equal-diameter or unequal-diameter rings and are in a same or different numbers;
the secondary sub-rings in each sub-unit are in a number of 2 or more and have a same or different diameters;
the included angle formed by connection lines between circle centers of adjacent secondary sub-rings and the circle center of the sub-ring in which the adjacent secondary sub-rings are located is at any degree;
the secondary sub-rings in different sub-units are equal-diameter or unequal-diameter rings and are a same or different in number; and
the modulation sub-rings in each modulation basic unit are in a number of 2 or more and have a same or different diameters, the included angle formed by connection lines between circle centers of adjacent modulation sub-rings and a circle center of the modulation ring in which the adjacent modulation sub-rings are located is at any degree, and the modulation sub-rings in different modulation basic units are equal-diameter or unequal-diameter rings and are a same or different in number.

3. The optical window according to claim 2, wherein:
the diameters of the sub-rings in a basic unit are the same and the included angles formed by the connection lines between the circle centers of adjacent sub-rings and the circle center of the basic ring are equal;
the diameters of the secondary sub-rings in a sub-unit are the same and the included angles formed by the connection lines between the circle centers of adjacent secondary sub-rings and the circle center of the sub-ring in which the adjacent secondary sub-rings are located are equal;
the diameters of the modulation sub-rings in a modulation basic unit are the same and the included angles formed by the connection lines between the circle centers of adjacent modulation sub-rings and the circle center of the modulation ring in which the adjacent modulation sub-rings are located are equal.

4. The optical window according to claim 3, wherein:
the sub-rings in different basic units are a same in number and equal in diameter;
the secondary sub-rings in different sub-units are the same in number and equal in diameter; and
the modulation sub-rings in different modulation basic units are the same in number and equal in diameter.

5. The optical window according to claim 4, wherein:
the secondary sub-rings in different sub-units are at a same relative position and are arranged in the basic ring after duplicating one sub-unit;
the sub-units in different basic units are at a same relative position;
the modulation sub-rings in different modulation basic units are at a same relative position and one basic unit and one modulation basic unit are duplicated and closely arranged according to a two-dimensional orthogonal arrangement to together form a two-dimensional metal grid.

6. The optical window according to claim 4, wherein:
the secondary sub-rings in different sub-units in one basic unit are at different relative positions and are arranged in the basic ring after duplicating one sub-unit, wherein any sub-unit rotates by a certain angle around a circle center of a respective sub-ring in a two-dimensional plane with respect to other sub-units in a same basic ring;
in a same row, the sub-units in adjacent basic units are at different relative positions, the modulation sub-rings in adjacent modulation basic units are at different relative positions and one basic unit and one modulation basic unit are duplicated and closely arranged according to a two-dimensional orthogonal arrangement to form a two-dimensional metal grid, wherein any basic unit rotates by a certain angle around a circle center of a respective basic ring in a two-dimensional plane with respect to the adjacent basic unit, and any modulation basic unit rotates by a certain angle around a circle center of a respective modulation ring in a two-dimensional plane with respect to the adjacent modulation basic unit.

7. The optical window according to claim 6, wherein:
any basic unit rotates by a same angle with respect to an adjacent basic unit in a same row, and any modulation basic unit rotates by a same angle with respect to an adjacent modulation basic unit in a same row.

8. The optical window according to claim 1, wherein:
a ratio of an inner diameter to an outer diameter of the concentric sub-ring pairs is in a range of 0.2 to 0.8 and a ratio of an inner diameter to an outer diameter of the concentric modulation ring pairs is in the range of 0.2 to 0.8;
the ratios of the inner diameter to the outer diameter of the concentric sub-ring pairs in different sub-units are same or different and the ratios of the inner diameter to the outer diameter of the concentric modulation ring pairs in different modulation basic units are same or different;
adjacent sub-rings in the basic unit are connected in an externally tangential manner or are intersected with each other, adjacent secondary sub-rings in the sub-unit are connected in an externally tangential manner or are intersected with each other, and the secondary sub-rings are tangentially connected or intersected with an internal ring of the concentric ring pair in the sub-unit in which the secondary sub-rings are located;
adjacent modulation sub-rings in a modulation basic unit are connected in an externally tangential manner or are intersected with each other and modulation sub-rings are tangentially connected or intersected with an internal ring of the concentric ring pair in the modulation basic unit in which the modulation sub-rings are located; and
tangential connection includes external tangential connection or internal tangential connection.

9. The optical window according to claim 1, wherein:
the basic rings, the concentric sub-ring pairs, the secondary sub-rings, the filling rings, the concentric modulation ring pair, the modulation sub-rings, and the connection metal comprise an alloy having good conductivity and the alloy having a thickness of greater than 100 nanometers (nm).

10. The optical window according to claim 1, wherein an adhesive layer comprises chromium or titanium material.

* * * * *